United States Patent [19]

White et al.

[11] Patent Number: 5,596,373
[45] Date of Patent: Jan. 21, 1997

[54] METHOD AND APPARATUS FOR PROVIDING PROGRAM ORIENTED INFORMATION IN A MULTIPLE STATION BROADCAST SYSTEM

[75] Inventors: Gail K. White, Hackensack; Fujio Noguchi, Ridgewood, both of N.J.; Kazuhiko Akaike, Tokyo, Japan; Mark Schaffer, Hackensack, N.J.

[73] Assignees: Sony Corporation, Tokyo, Japan; Sony Electronics, Inc., Park Ridge, N.J.

[21] Appl. No.: 369,673

[22] Filed: Jan. 4, 1995

[51] Int. Cl.⁶ .................................................. H04N 5/50
[52] U.S. Cl. ........................ 348/569; 348/906; 348/7
[58] Field of Search ............................... 348/906, 7, 12, 348/13, 569, 734, 564; 455/4.1, 4.2, 5.1; 395/156; H04N 5/50

[56] References Cited

U.S. PATENT DOCUMENTS

| | | | |
|---|---|---|---|
| 4,751,578 | 6/1988 | Reiter et al. | 348/906 |
| 4,855,833 | 8/1989 | Kageyama et al. | 358/183 |
| 5,253,066 | 10/1993 | Vogel | 358/188 |
| 5,315,392 | 5/1994 | Ishikawa et al. | 348/570 |
| 5,317,403 | 5/1994 | Keenan | 348/731 |
| 5,323,234 | 6/1994 | Kawasaki | 348/6 |
| 5,353,121 | 10/1994 | Young et al. | 348/563 |
| 5,416,508 | 5/1995 | Sakuma et al. | 348/906 |

Primary Examiner—Victor R. Kostak
Attorney, Agent, or Firm—Blakely, Sokoloff, Taylor & Zafman

[57] ABSTRACT

An innovative but easy to use on-line program list is provided to provide the user of a multiple channel television broadcast system a wealth of programming information in a simple format that is easy to understand. The guide enables the user to easily select a particular program to watch or to watch in the future. Unlike prior art television guides, the present invention presents a program list that is oriented according to the program instead of the channel. In particular, the program list provides program information and the times the program is broadcasted the displayed timeframe. This is particularly useful for viewing in one simple and easy-to-read format the start times of a pay-per-view program, which may, for example, be broadcasted every ½ hour over a variety of channels.

26 Claims, 14 Drawing Sheets

FIG. 1 (Prior Art)

| | 12:30PM | 1:00PM | 1:30PM | 2:00PM |
|---|---|---|---|---|
| Movies Guide | | | | Thurs 12/16/94 1:54PM |
| OTV 149 | Seduce Me: Pamela Principle 2 | | | Seduce Me: Pamela Pr... |
| MTV 150 | | | | |
| C TV 151 | | | | |
| OTV 154 | The Ref | | The Ref | |
| OTV 155 | | The Chase | | |
| STV 156 | | | | |
| ▼ | Themes | Sports | Other | All | Exit |

METHOD AND APPARATUS FOR PROVIDING PROGRAM ORIENTED INFORMATION IN A MULTIPLE STATION BROADCAST SYSTEM

FIELD OF THE INVENTION

The present invention relates to the presentation of program oriented station guide in a multiple station television system.

ART BACKGROUND

Television broadcasting technology has improved tremendously since its inception. Today, television signals are broadcasted on the airwaves through cables and via satellite. The number of stations accessible today has increased from one to hundreds of stations. To select a program to view, many viewers simply "channel surf" until they find a channel that has a desirable program. Channel surfing refers to the process of using the channel "+" or "−" key to sequentially view each channel. Although some viewers find channel surfing among hundreds of stations enjoyable, most viewers prefer a more direct method for selecting a program to view.

Some systems, for example, the RCA Direct Satellite System™ or DSS™ (Direct Satellite System and DSS are trademarks of Hughes Communications, a division of General Motors Corp.), provides a television channel selection guide which displays a listing of the channels typically in numeric order and the titles of the programs broadcasted or to be broadcasted on the channels. A simplified block diagram of such a guide is illustrated in FIG. 1. The viewer or user of the system may then select the channel by entering in the number or selecting the device. The system responds by removing the guide displayed and tuning to the station selected and displaying the broadcasting signals of the station.

This system has a number of drawbacks. The guide provides only the title of the program. To get additional information, such as a written description of the program, the user must select an information button which responds by bringing up a second layer of the menu having the program description. Thus, as the number of stations increase, the efficiency of reviewing programs and program descriptions decreases. Furthermore, many viewers prefer to view the actual broadcast before determining whether to select that station to watch. Therefore, in the RCA system, the user has to select each station to view, and subsequently go back to the channel guide in order to view program titles on other channels. Of course, the user can always channel surf by skipping from channel to channel in sequence using the channel "+" or "−" buttons. In addition, television stations, such as network stations, satellite TV, cable and Pay Per View stations will take advantage of the hundreds of channels that will be available for broadcast. A single source, e.g., a single station, may start broadcasting the same program on different channels as often as every 15–20 minutes to span its audience's viewing time preferences. For moves this is often referred to as "Near Video on Demand", because it attempts to provide the ability for a viewer to select a movie to view at any time.

SUMMARY OF THE INVENTION

It is therefore an object of the present invention to provide a method and apparatus for selection of programs on a multiple station television system.

Furthermore, it is an object of the present invention to provide a program oriented electronic programming guide.

In the method and apparatus of the present invention an innovative but easy to use on-line guide is provided to provide the user of the system a wealth of information in a simple format that is easy to understand. Unlike prior art television guides, the present invention presents a guide that is oriented according to the program instead of the channel. In particular, the guide provides program information and broadcast time information. The guide is organized in an XY grid with the X axis displaying a certain block of time (e.g., two hours) and the Y axis displaying program information organized independently of channel information. For example, the Y axis may display program titles organized in alphabetical order. The X axis displays the time or times each program is displayed by highlighting the corresponding time slot. Other embodiments provide the generation of the program guide according to the category of programming the user is interested in.

BRIEF DESCRIPTION OF THE DRAWINGS

The objects, features, and advantages of the present invention will be apparent to one skilled in the art from the following detailed description in which:

FIG. 1 is a simplified illustration of a prior art direct digital satellite system guide display.

DETAILED DESCRIPTION OF THE INVENTION

In the method and apparatus of the present invention the broadcast system described is a direct broadcast satellite system. However, it is readily apparent to one skilled in the art that other broadcast systems which have the capability of receiving and displaying a multiplicity of stations may utilize the method and apparatus of the present invention. Furthermore, in the following description, for purposes of explanation, numerous details are set forth, such as menus, flowcharts and system configurations, in order to provide a thorough understanding of the present invention. However, it will be apparent to one skilled in the art that these specific details are not required in order to practice the present invention. In other instances, well known electrical structures and circuits are shown in block diagram form in order not to unnecessarily obscure the present invention.

Figure 2:
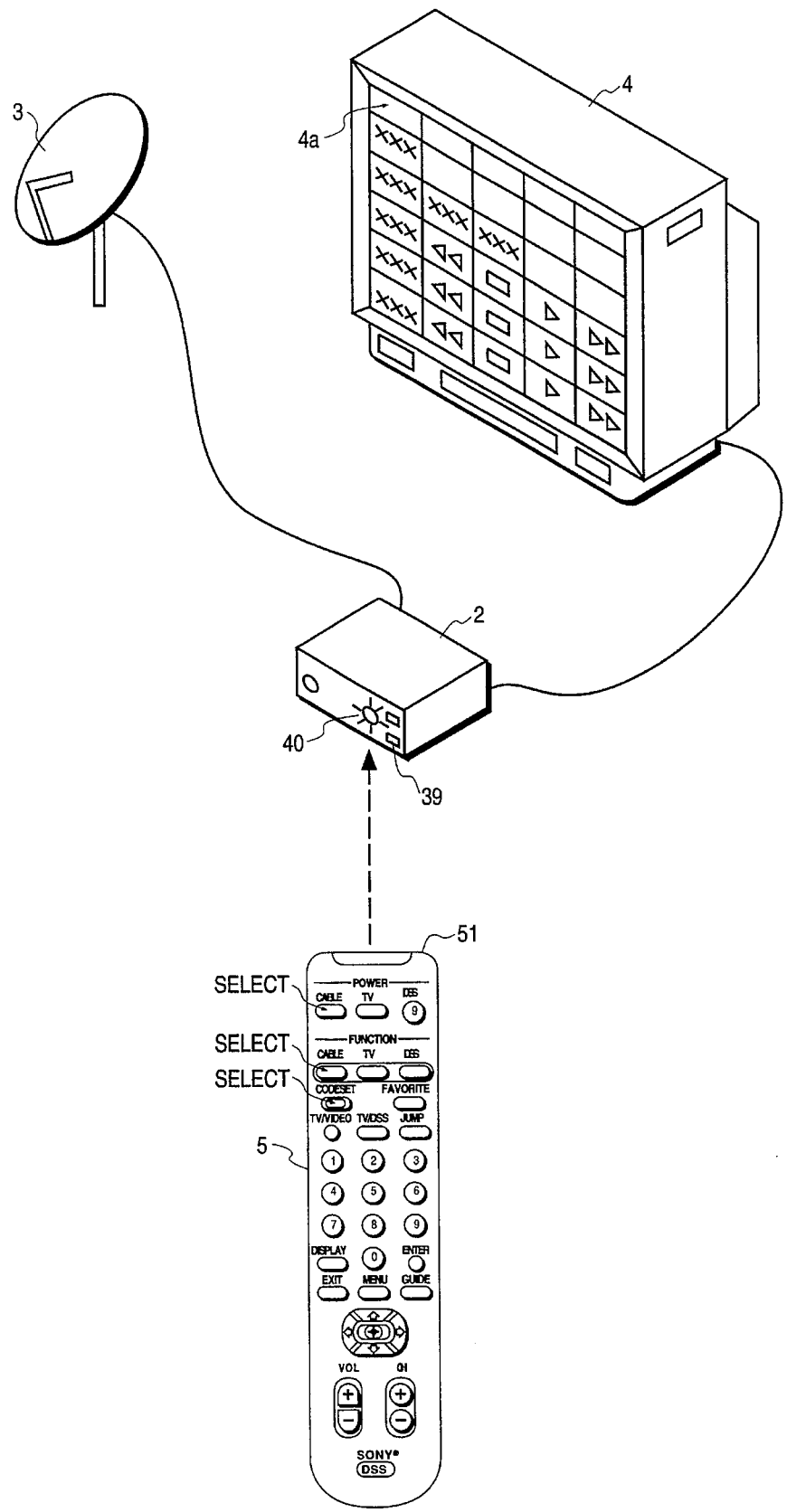
FIG. 2 is a simple illustration of one embodiment of the present invention.

FIG. 2 is a simplified diagram illustrating a Direct Satellite System (DSS). The system has an antenna 3, an integrated receiver/decoder 2 (IRD), a remote controller 5 and a monitor 4. The packets are transmitted by a transponder on the satellite. Each transponder transmits data in a time share manner at a predetermined frequency. A tuner 21 of a decoder is tuned in to the frequency of the transponder corresponding to a channel, which is designated by a viewer so that the packets of digital data are received by the decoder.

The antenna 3 receives an encoded data signal sent from a satellite. The received encoded signal is decoded by the IRD. The antenna 3 has a low noise block down converter 3a (LNB). The LNB 3a converts a frequency of a signal sent from the satellite to another frequency. The converted signal is supplied to the IRD 3. The monitor 4 receives a signal from the IRD 3.

Figure 3:
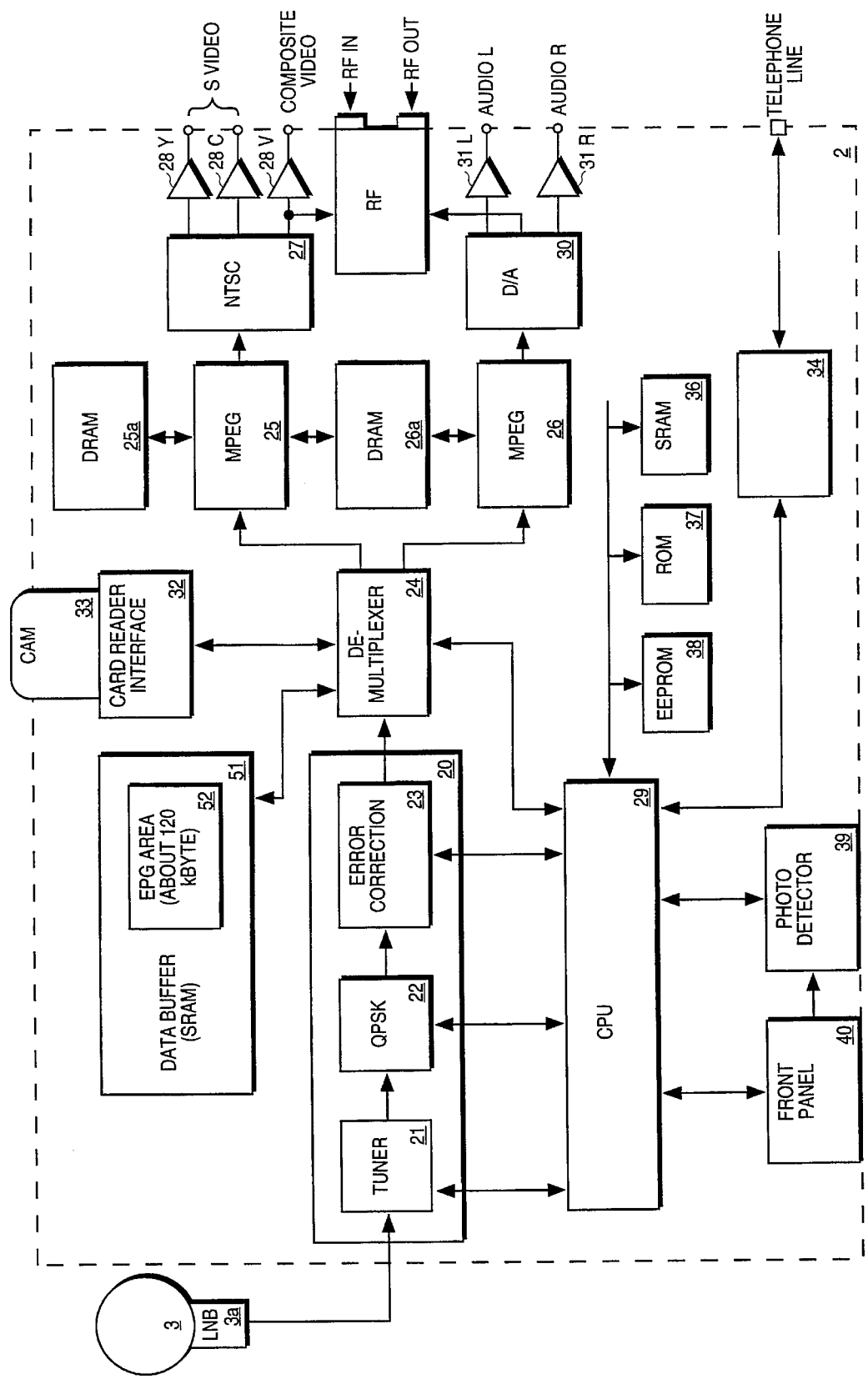
FIG. 3 is a block diagram representation of the elements utilized in the receiver of the television signals.

FIG. 3 is a block diagram of the IRD 3. A radio frequency (RF) signal output from the LNB 3a of the antenna 3 is supplied to a tuner 21 of a front end 20. The output from the tuner 21 is supplied to a QPSK demodulation circuit 22 for demodulation. The output from the QPSK demodulation circuit 22 is supplied to an error correcting circuit 23 for error correction. The data is received in encrypted and encoded (i.e., compressed) form.

The transport IC 24 receives the data stream, consisting of packets of data, from the error correcting circuit 23 and directs portions of the data stream to the appropriate circuit for processing. The digital data stream sent from a satellite includes headers for classifying the different portions of the data in the digital data stream. The transport IC stores the headers in registers and uses the headers to direct the data. The data stream sent from the satellite, includes video data in the format specified by the Motion Pictures Expert Group standard (MPEG), MPEG audio data and electronic programming guide (EPG) data. Data that is identified by its header to be video data is transferred to MPEG video decoder 25. Data that is identified by its header to be audio data is transferred to MPEG audio decoder 26. Similarly, data having a header that identifies the data to be EPG data is transferred to a predetermined area in the data buffer 51 designated to store the EPG.

A conditional access module 33, includes a CPU, a ROM and a RAM. The conditional access module determines whether the user has the authorization to receive certain data, e.g., audio/video for a pay TV station, using the authorization information stored in its memory. Thus, if the conditional access module determines that the user is authorized access, a key to decrypt the incoming data is provided to the transport IC 24, which decrypts the data using the key provided. In the present embodiment, a smart card is utilized. This card is inserted into the card reader interface 32 for interface to the transport IC 24. It is readily apparent to one skilled in the art that the conditional access module is not limited to smart cards and may be configured in other kinds of circuitry.

The MPEG video decoder 25 decodes the video signal received from the transport IC. DRAM 25a, connected to the MPEG video decoder 25, is used for buffering and storage of video data during processing by the MPEG video decoder. The decoded digital video signal is supplied to an NTSC encoder 27 and converted to a luminance signal (Y) and a chroma signal (C) which are respectively output through a buffer amplifier 28Y or 28C as an S video signal. A composite video signal is also output through a buffer amplifier 28V.

The MPEG audio decoder 26 decodes the digital audio signal. DRAM 26a, connected to the MPEG audio decoder 26, is used for buffering of data and information during processing by the MPEG audio decoder 26. The decoded digital audio signal is converted into an analog audio signal by D/A converter 30. The left audio signal is output through buffer amplifier 31L and the right audio signal is output through buffer amplifier 31R.

An RF modulator 41 mixes a composite signal output from the NTSC encoder 27 with an analog audio signal output from the D/A converter 30. The RF modulator 41 converts the mixed signal into an RF signal and outputs the RF signal therefrom.

The CPU 29 is the central control mechanism and executes code stored in the ROM 37 to perform certain functions of the system. For example, the CPU processes certain data to control the generation of the program list in accordance with the teachings of the present invention. In addition, the CPU receives and processes the user input, received from the front panel buttons or switches 40 and the photodetector circuit 39 to provide the user functionality and access to the system described herein. In addition, the CPU accesses user settings/preferences for processing of information and configuration of the system. The user settings are stored in the non-volatile memory, such as EEPROM 38. In addition, the CPU maintains a list of pointers, stored in SRAM 36, to the channel information and program information stored in the SRAM 51. Thus, when a user wishes to display a form of the EPG on the screen, the CPU 29, accessing pointers stored in the SRAM 36, communicates to the transport IC 34 to retrieve the data from the data buffer (SRAM) 51 identified by the pointers. The CPU then formulates the format and other digital data which forms the guide or list on the screen and forwards the data representative of the guide/list to the transport IC 34 which forwards data the DRAM 25a of the MPEG video decoder 25 for subsequent output to the screen.

Figure 4:
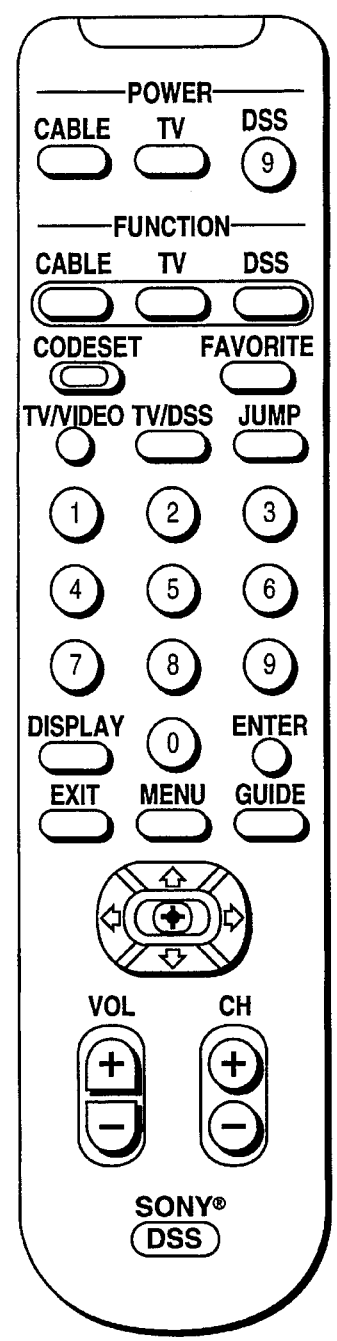
FIG. 4 is a representation of a remote control utilized to tune television stations in accordance with the teachings of the present invention.
Figure 5:
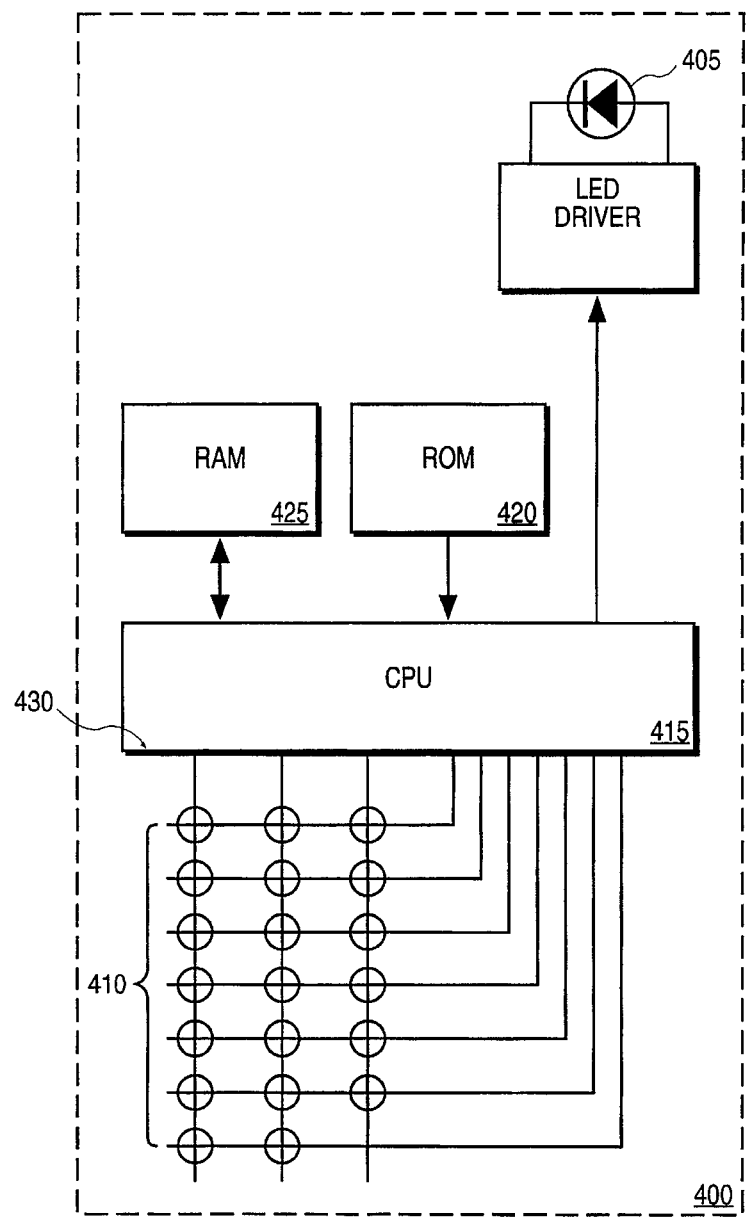
FIG. 5 is a simplified block diagram of the circuitry utilized in a remote control device.

FIG. 4 shows an example of a remote controller utilized by a user to transmit commands and make program selections in accordance with the teachings of the present invention. FIG. 5 is simplified a block diagram of the remote controller. The remote controller 400 has an infrared originating device 405, a set of operation buttons 410, a CPU 415, a ROM 420 and a RAM 425. The CPU 415 receives a signal sent from an operation button 410 through an input port 430. The signal is processed according to a program stored in the ROM 420. The RAM 425 is used as a working space so as to produce a transmitting code. The transmitting code is sent to the infrared originating device 405 through an output port and converted into an infrared signal. The infrared signal is transmitted to the IRD. The operation buttons 410 include a direction key for designating a pointer direction such as north, south, east and west, an "EPG" key, a "FAVORITE" key, a "SELECT KEY", a "MENU" key, an "EXIT" key, a ten-key numeric keypad and an "ENTER" key. The set of operation buttons 410 enable the user to select programs through the electronic programming guide in accordance with the teachings of the present invention.

Figure 6:
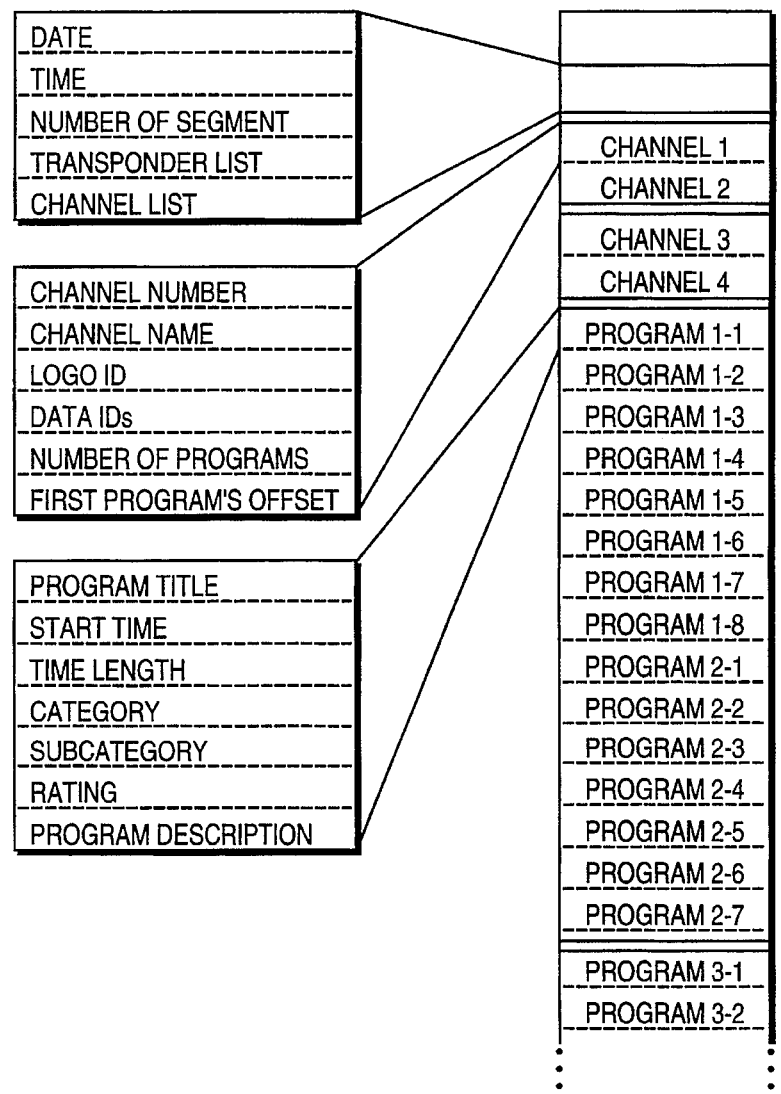
FIG. 6 illustrates the type of data utilized to present the program list in accordance with the teachings of the present invention.

FIG. 6 is a block diagram illustration the data stored in a portion of the data buffer RAM 51. As noted above, the RAM 51 stores EPG data including guide data, channel data and program data. General information is included in the guide data, for example, the current data and time. The transponder list identifies the number of the transponder transmitting a segment. The channel list identifies the channel number of the first channel of a portion of data. The channel data includes data relating to channels, such as the channel number, channel name (i.e., the call sign of a broadcast station), logo ID (i.e., an identification of the channel logo), data ID, which is an identification of a channel number of MPEG video data or MPEG audio data, number of programs, which identifies the number of programs to be transmitted on a channel during a predetermined timeframe, first program offset which identifies the offset from the header to the first channel data in a segment.

The program data includes the program title, start time of the program, time length of the program, program category such as movies, news, sports, etc., program sub-category such as drama, horror, children's movies or baseball, basketball, football for the sports category, the movie rating and program description that provides a detailed description of the program.

Figure 7:
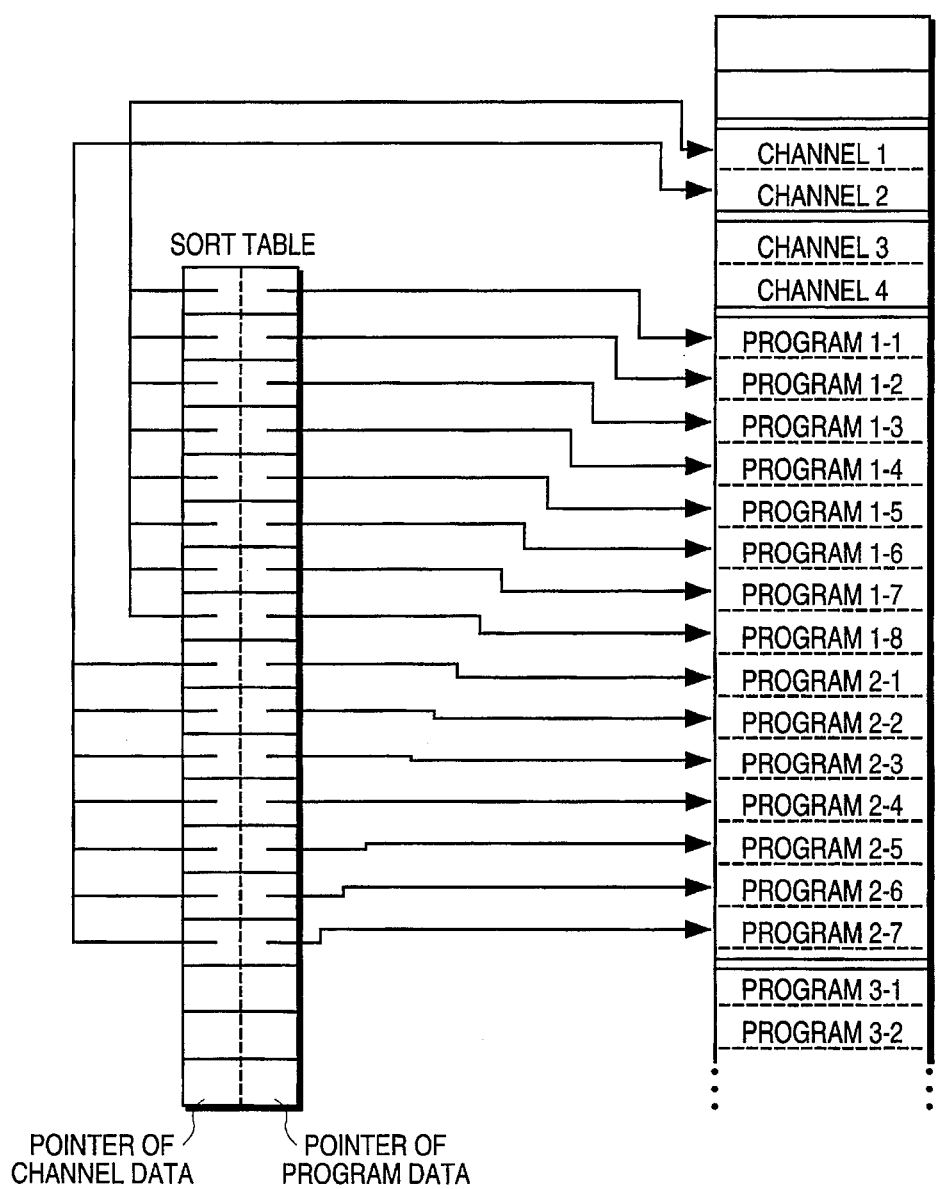
FIG. 7 illustrates the pointers to the data utilized to generate the program listings in accordance with the teachings of the present invention.

FIG. 7 illustrates how pointers to the EPG data is sorted for display of a guide on the user's television screen. As noted above, EPG data includes guide data, channel data and program data which are stored in the Data Buffer (RAM) of IRD (as shown in FIG. 3). When a viewer selects a channel, the CPU of the system determines the packet containing the channel information and extracts the transponder number from the channel information. The system front end starts tuning in the frequency of the designated transponder so as to receive the data transmitting from that transponder. If a viewer does not select any channel, the last channel is designated.

As noted above, the CPU generates a table of pointers 736 to the EPG stored in the memory. The table 736 is used for changing the order of channels or programs according to the information to be presented in the guide to the user. The table 736 includes an entry for the address pointer to the corresponding channel data and an entry to the corresponding program data.

A table for generating display information is stored in the ROM 37. Certain data from the table is read out from the ROM 37 and stored in DRAM 25a. Preferably the data is stored in compressed form. Therefore, when a character is displayed on a screen, the compressed character array is decoded so as to generate the character to be displayed. The encoder references a dictionary which includes a set of words and frequently used portions of words and numbers corresponding to each word or portion of a word. The encoder encodes each word to each number by using the dictionary. The decoder references the same dictionary as the encoder to perform the decode function. Once decoded, each character of the decoded word includes a character code corresponding to an ASCII code. Nonvolatile memory (e.g., EEPROM 38) has two tables. The first table contains character bitmaps in the different fonts available for each character. The second table identifies the address in the first table at which to extract the character bitmap. The address is determined according to the character code. The bit map image of the character is transmitted to DRAM 25a and subsequently accessed to display the character on the screen.

In the present embodiment, the channel data is received from a predetermined transponder and the channel number and channel name are stored in DRAM 25a. Additional channel information such as the channel logo is stored in the ROM 36. The ROM 36 preferably includes a table of Logo IDs and the address of Logo Data stored in ROM 36. Therefore, once a Logo ID is determined, the address of the Logo Data is determined, retrieved and stored in DRAM 25a.

The channel data provides the beginning address of the program data for a particular program. The actual location on the screen the program information is displayed is dependent upon the format of the guide. For example, in a time-based system, the location where the program title is displayed is determined by the start time and time length stored in the program data.

Figure 8:
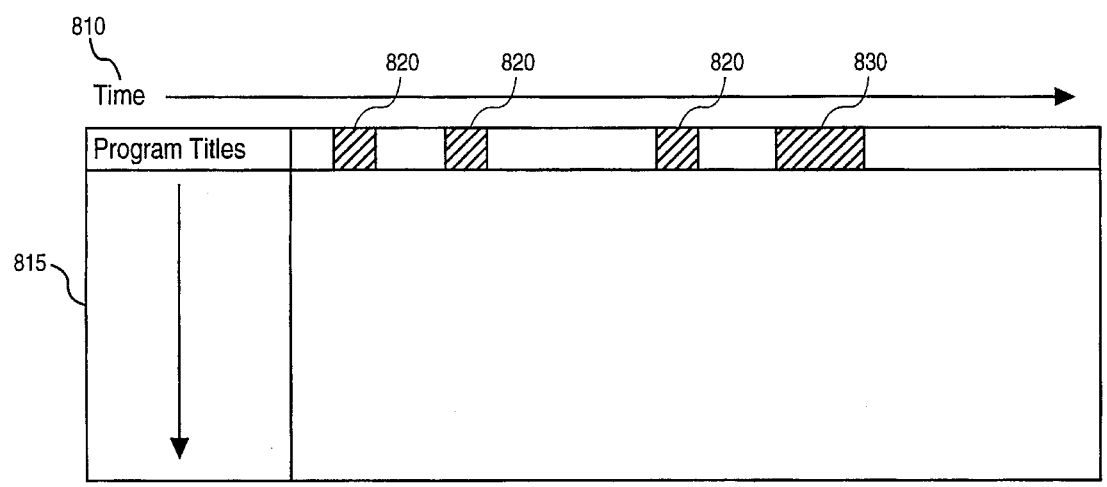
FIG. 8 is a simple block diagram of the components of the program list in accordance with the teachings of the present invention.

Using this information downloaded from the satellite transmission, program information is provided to the viewer. In the system and method of the present invention, the program information is provided to the user in an innovative manner in order to enable the viewer to easily view and select programs according to the category of programs. FIG. 8 illustrates the format of a program list. Referring to FIG. 8, the program list will identify programs of a selected category, for example, movies, and list them according to title 825 in a determined order, for example, in alphabetical order. Adjacent to each program title 825 are blocks 820, that identify each time in the displayed time period identified by the time line 810. This is quite advantageous for determining available programming according to program content as opposed to channels the program is broadcasted on. For example, a recent movie provided by a pay-per-view service may be broadcasted upwards of 15 times a day on multiple channels. Using the program list, the user is able to see in one line of the easy to view display the start times of the movie for the displayed time period. If more than one channel is to broadcast the same program and the start times overlap the identified time period increments, for example, ½ hour increments, the start time indicator will reflect the time periods such as start time indicator 830.

Figure 9:
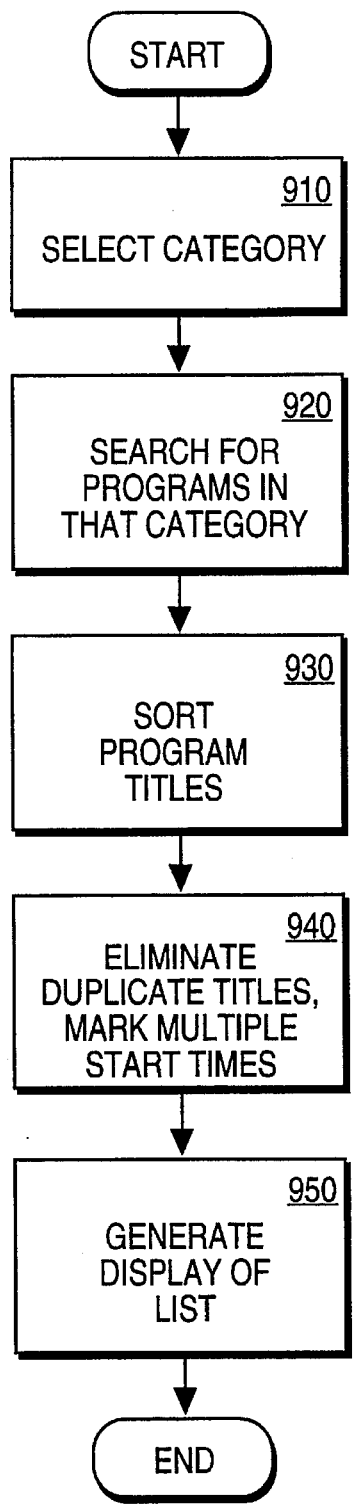
FIG. 9 is an exemplary flow diagram illustrating the process for generating the program list display.

FIG. 9 is a simple flow diagram illustrating an exemplary process for displaying the program guide. At step 910, the category is selected. In the present embodiment, a category selection menu is selected through the main menu accessed by depressing the "menu" button on the remote controller or front panel display. An example of the main menu is shown in FIG. 11.

Figure 11:
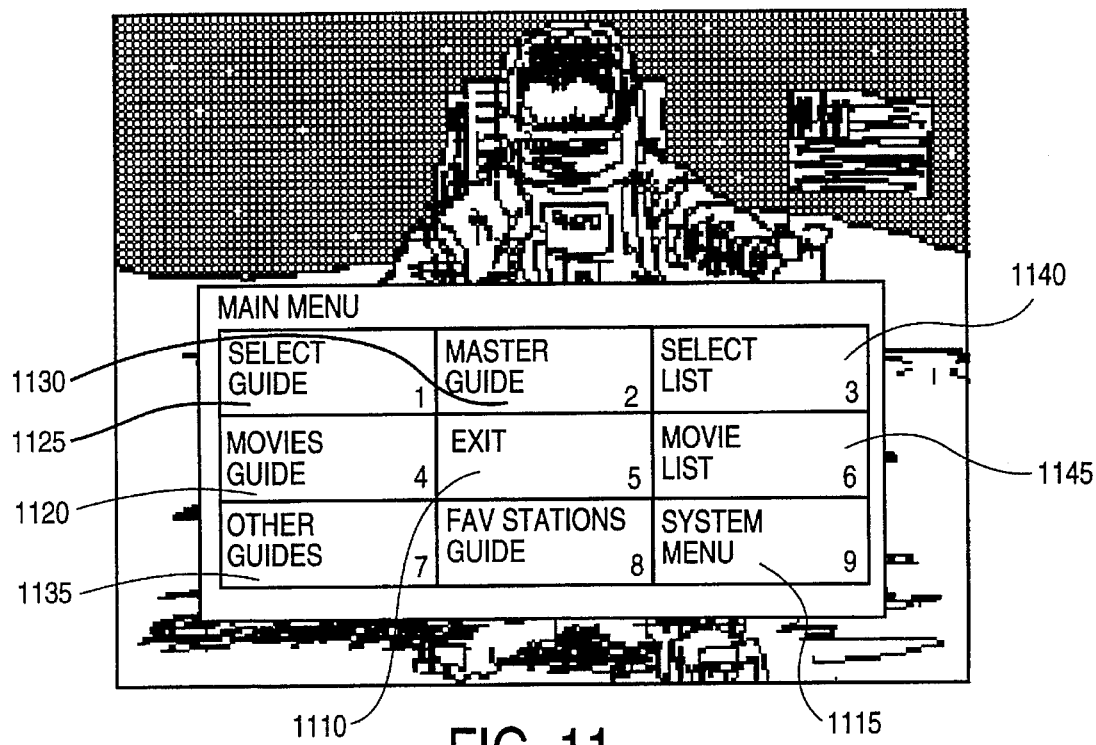
FIG. 11 is an exemplary display of the main menu of one embodiment of the present invention.

In the embodiment shown in FIG. 11, the main menu enables the user to perform such functions on screen such as viewing different guides or lists, setting system functions, viewing attractions, and purchasing pay-per-view programs. The main menu has items which are arranged in the 3×3 matrix. The center item 1110 is used to exit the menu. Other items include a system menu 1115 which includes certain system functions as well as a submenu to access certain user specific settings. The main menu further provides entry into submenus that provide programming in a guide or channel oriented format, 1120, 1125, 1130 and 1135. Items 1140, 1145 provide access to program lists in accordance with the teachings of the present invention. In particular, the present main menu includes a "Movie List" 1145 as this type of program list is frequently requested by a user. However, the user may select to view program lists of other categories of programming. The user can select the categories through the "Select Lists" item 1140 in the main menu.

When the user initially enters the main menu, the pointer is currently positioned at the center of the menu 1100 enabling the user to immediately exit the main menu 1201 if inadvertently entered. Once in this menu the user can select an item using the display cursor or highlight keys such as the up arrow and down arrow and right and left arrow keys on the remote controller, or by depressing one of the numeric keys which corresponds to the numeric identifier. This physically corresponds with the arrangement of the actual numeric keys on the remote controller. It should be noted that when these menus are displayed, the menus are displayed superimposed over the current broadcasted station enabling the user to navigate through the menus to enable/ disable certain functions or selection while still keeping the broadcast active and displayed in part.

Figure 12:
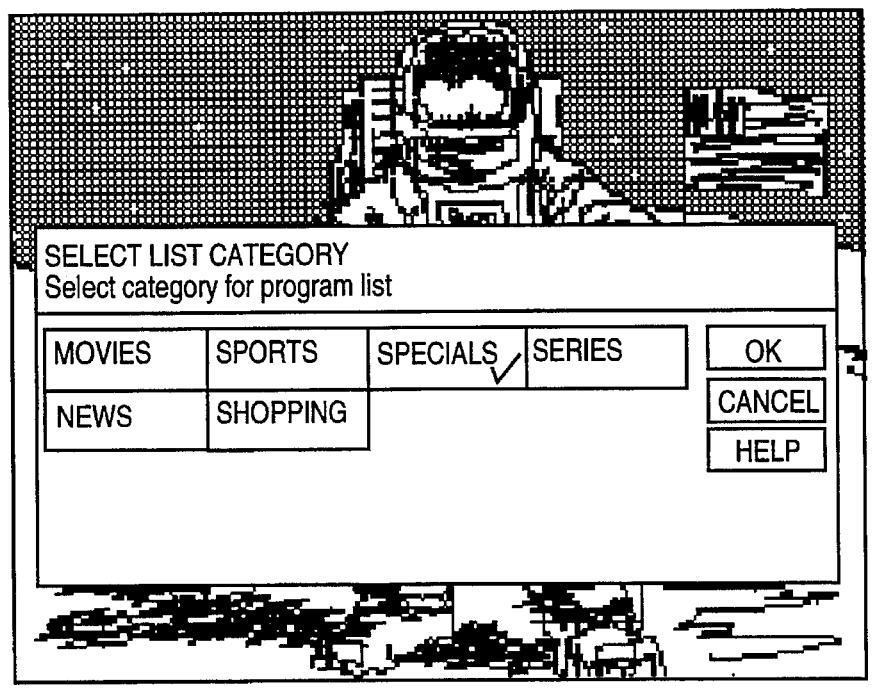
FIG. 12 is an example of a display used to select program categories in one embodiment of the present invention.

When the user wishes to view of program list of a particular category of programming, the "Select Lists" 1140 item is selected bringing up the category list as shown in FIG. 12. It is readily apparent that the categories shown are illustrative and that other categories may be used. In the present illustration the user has selected the category "Specials", as denoted by the check mark 1210 shown. Although only one category is shown here, it is apparent that multiple categories can be selected by placing the pointer over the appropriate category box and indicating selection (for example, by depressing the select key).

Figure 13:
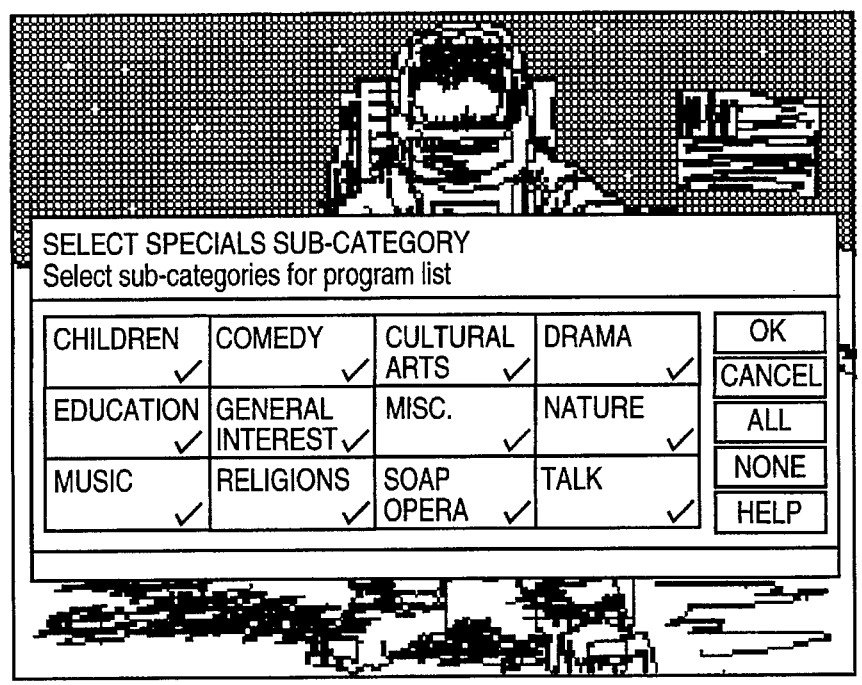
FIG. 13 is an illustrative display used to select sub-catagories in accordance with the teachings of the present invention.

After the user has selected a category, a subcategory screen is displayed to enable the user to further define the programs the user is interested in. An example of a subcategory display for the "specials" category is shown in FIG. 13. It is readily apparent that the sub-catagories are in part category dependent. Therefore, depending upon the category selected, the subcategories may change. The user can select all or some of the subcategories. In the present illustration, the user has selected all the subcategories.

Referring back to FIG. 9, once the user has selected the categories, the system responds by searching the program data to find those programs that are defined in that category, step 920. In the present broadcasting system, the category information is provided by the service as part of the programming information (see FIG. 6). However, it is readily apparent that the category information may be provided by other means.

Once the programs meeting the category criteria have been identified, the programs are sorted, step 930, to present the programs in a logical manner to the user. Preferably, the programs are sorted alphabetically according to program title. Duplicate titles, for example, entries representing a pay-per-view special that starts every ½ hour on several different channels, are condensed, step 940, into one entry which reflects multiple start times. The system then generates the program list display and displays the list generated, step 950, to the user.

Once the program list is displayed, the user can view in a clear informative format program descriptions, categories/ sub-catagories and channels which broadcast a particular program at a particular time. Furthermore, the user can purchase pay-per-view programming and select currently broadcasted programming to view.

Figure 14:
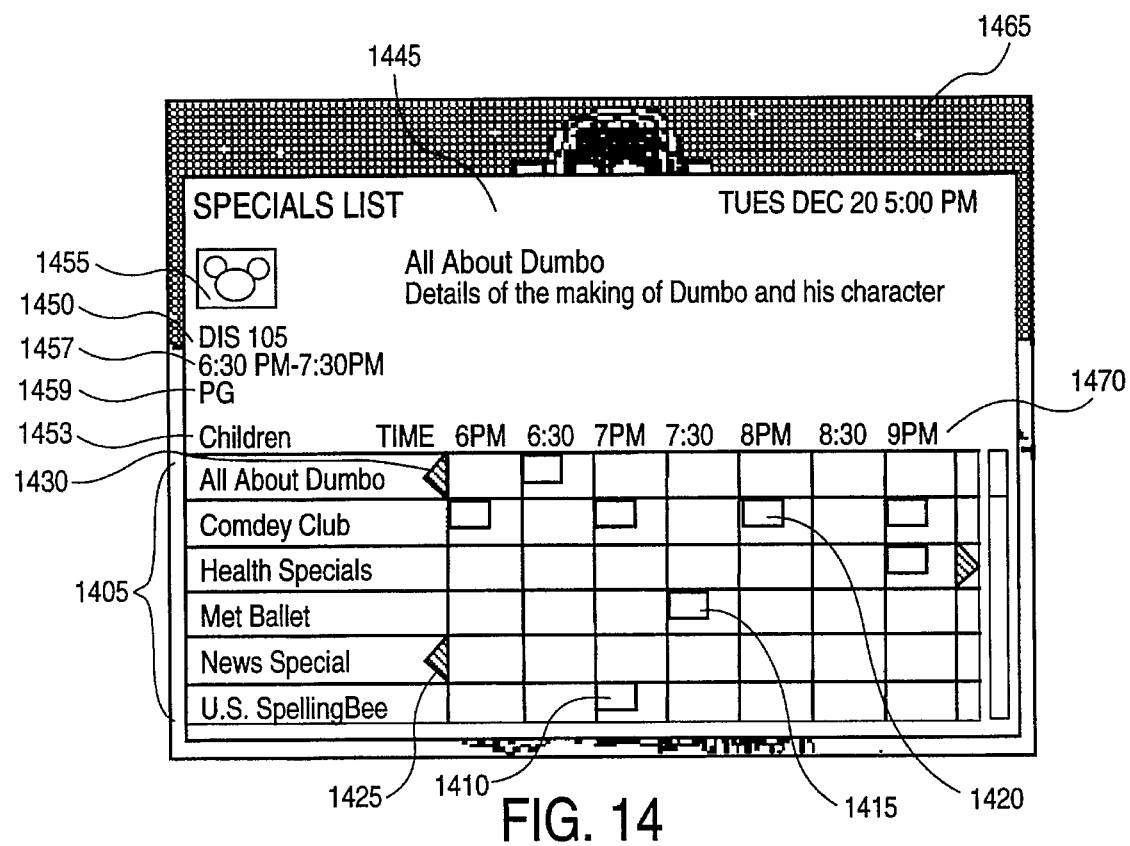
FIG. 14 is an illustrative display of a program list generated in accordance with the teachings of the present invention.

An example of a program list display is shown in FIG. 14. The program list includes a list of programs 1405, sorted alphabetically, that meet the category criteria and the times the programs occur. The times the programs are to be broadcasted are identified by the time bars 1410, 1415, 1420. Programs currently broadcasted are identified by the left arrows 1425, 1430.

The user can manipulate the system pointer to review information regarding a particular program or occurrence of a particular program. In the present embodiment, the pointer is reflected by a highlighted area of the 25 display. However, other types of pointers, such as an arrow superimposed on the display at the location of the pointer, can be used. An exemplary user interface process to the program list is illustrated by the flow diagram of FIG. 10.

Figure 10:
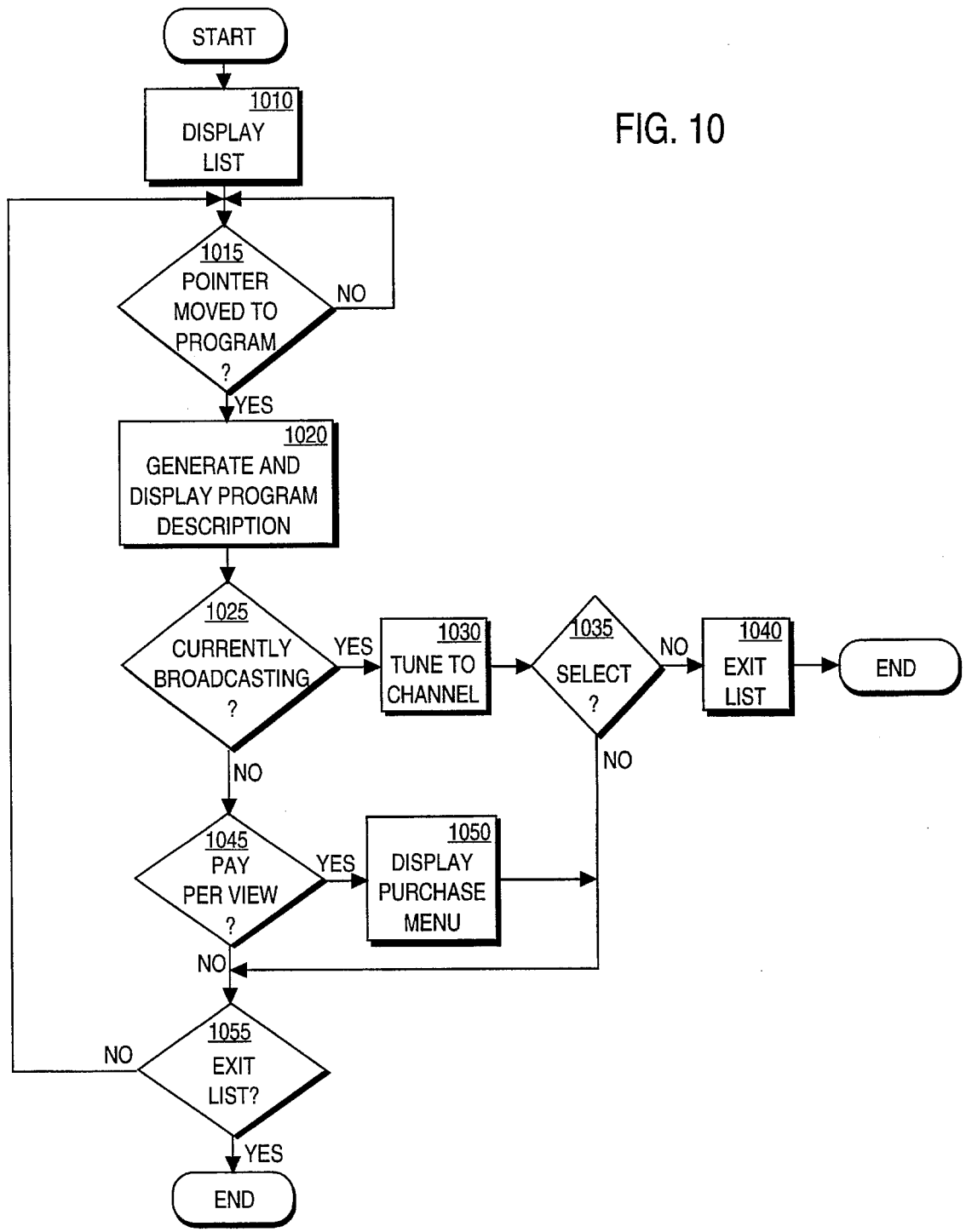
FIG. 10 is an exemplary flow diagram illustrative of the process for using the program list in accordance with the teachings of the present invention.

Referring to FIG. 10, once the program list is displayed, step 1010, the system monitors the movement of the system pointer, step 1015, as is indicated by depressing the menu up, down, right, left keys on the remote or front panel, or by movement of a joystick or similar pointer control device. When the pointer is moved to point to a different program, the system responds by retrieving the program information and displaying the program information, step 1020, in the program data area (1445, FIG. 14). In addition, referring to FIG. 14, the system displays subcategory of the program 1453, the channel the program will be broadcasted on 1450, channel logo 1455, time of broadcast 1457 and program rating 1459.

In the present embodiment, movement of the pointer to the position of a particular start time block, e.g., 1410, will provide the program description 1445 of the corresponding program and the channel information 1450, 1455 and complete program time information 1457 for the particular broadcast. In alternate embodiments, the user can also move the pointer to point to the program title 1405. In this instance a default standard is used to generate the channel and program time information. For example, information regarding the current or next broadcast of the program is displayed.

This program list is superimposed on the broadcast of a channel if the system pointer is located at the location of a currently broadcasted program. 25 Thus, the user not only is provided the program information, but is also provided the audio and video 1465 of the broadcasted program, all on the same menu level of the program list. By movement of the system pointer (in the present example, by manipulation of the information highlighted), the system will automatically tune to a channel if the program identified by the program list is currently broadcasted, enabling the user to stay in the menu while still previewing in part the broadcasted channel. Therefore, referring back to FIG. 10, if the pointer is pointing to a currently broadcasted program, step 1025, the system tunes to the channel providing the broadcast, step 1030. The user then has the opportunity to select the program to view, step 1035. If the user selects a program to view, for example, by depressing the select button on the remote control device, the system will exit the program list, step 1040, providing the user unobstructed video of the selected program.

Figure 15A:
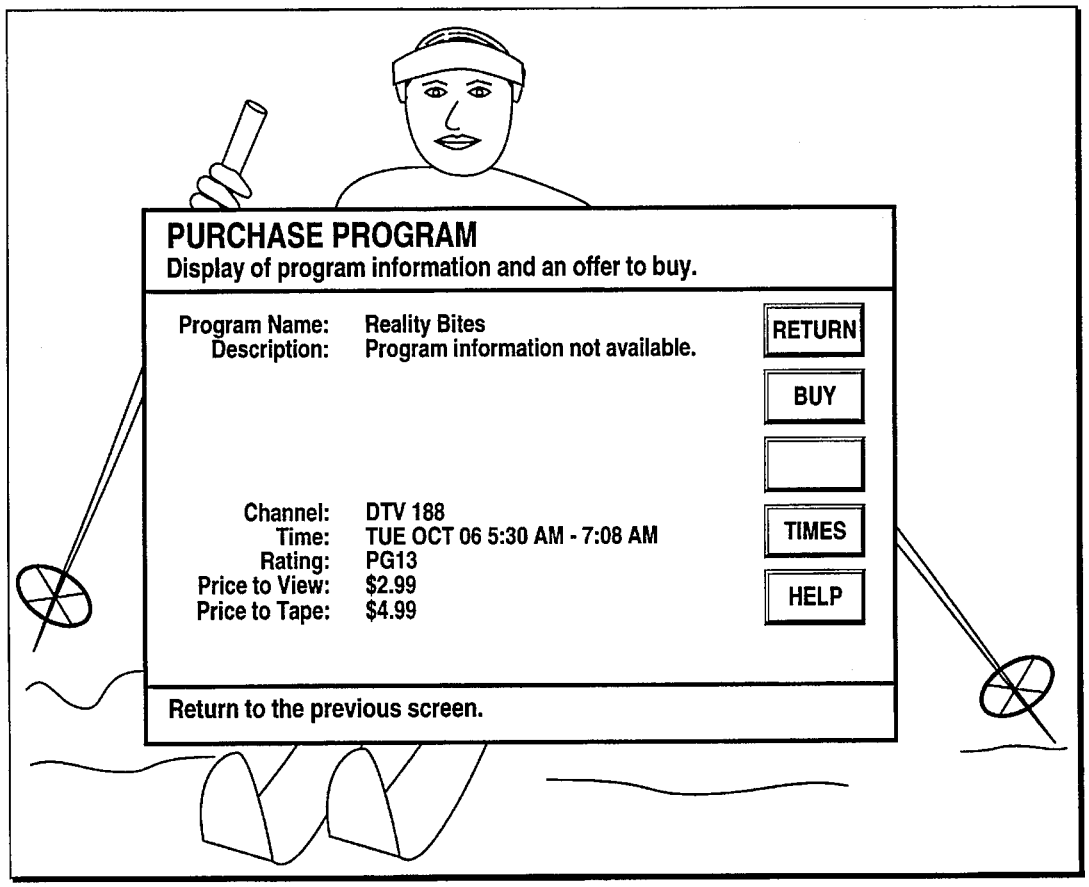
FIGS. 15A AND 15B are illustrative displays to enable the user to purchase pay-per-view programs.
Figure 15B:
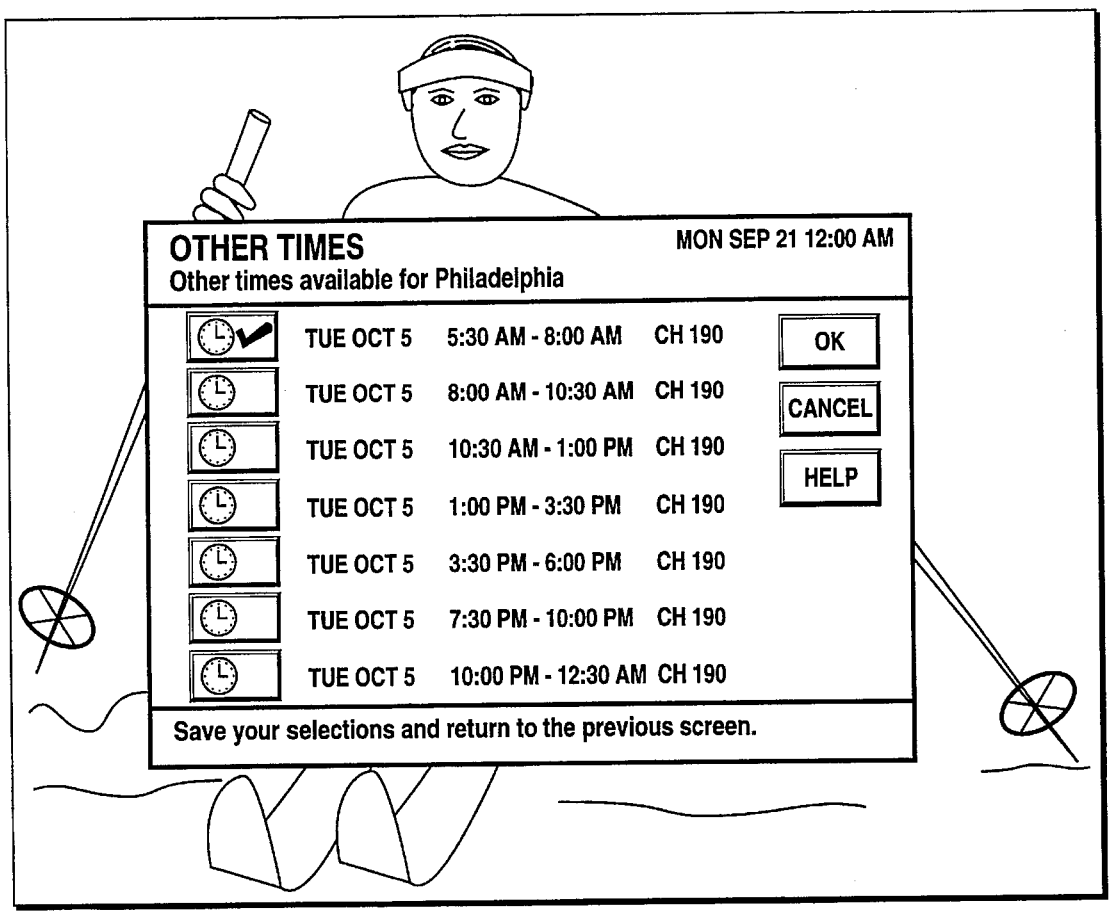

As noted above, the program list provides the user easy way to purchase pay-per-view programming. At step 1045, if the user moves the pointer to a program start time of a pay-per-view program, the system responds by providing a purchase menu. An example of a purchase menu is shown in FIG. 15A. Using the purchase menu, the user can select to purchase the program in advance or at the time of broadcast. Referring to FIG. 15A, if the user wishes to see a listing of other broadcast times for the selected program he selects the "Times" button 1505. The system responds by providing a listing of other times as shown in FIG. 15B. Selecting a particular time, as evidenced by the check mark 1510, and selecting OK, enables the user to purchase the program to view.

Referring back to FIG. 10, once the user is finished reviewing the program list, he exits the list, (e.g., FIG. 14) step 1055 and is returned back to the broadcast he was viewing prior to entering the program list. If the user wishes to view the programming in a different timeframe than that identified by the time bar 1470, the user moves the system pointer to the time bar and uses the pointer to move the pointer to the extreme left or right of the time bar, thereby causing the time bar to scroll in the corresponding direction. The system responds by extracting the programs of the selected category which have broadcasts in the timeframe displayed, sorting the programs and updating the display.

Thus, an innovative method and system for providing the large amounts of television program information to a user in a simple and easy to use format is describe. The invention has been described in conjunction with the preferred embodiment. It is evident that numerous alternatives, modifications, variations, and uses will be apparent to those skilled in the art in light of the foregoing description.

What is claimed is:

1. In a multiple channel broadcasting system in which programs are broadcast for display on a screen, a method for generating an on-screen program list to inform the user of programs available through the broadcasting system, said method comprising the steps of:

selecting a category of programs;

searching for selected programs occurring during a predetermined timeframe that are categorized as the selected category;

extracting program information comprising a program title and start time of selected programs; and generating an electronic program list on a display of the broadcasting system comprising the steps of;

identifying each selected program of the selected category by the program title;

identifying each start time of each selected program;

displaying the program title, and displaying each start time of the program adjacent to the program title;

wherein a user can easily view by program category and start times such that multiple occurrences of the same program during the predetermined timeframe are viewable in one program list.

2. The method as set forth in claim 1, wherein the step of selecting a category of programs comprises the steps of providing a listing of categories; and said user selects at least one category from the listing of categories.

3. The method as set forth in claim 2, wherein the step of selecting a category of programs further comprises the steps of providing a listing of sub-catagories for the selected category; and said user selects at least one sub-category from the listing of sub-catagories; wherein the program list comprises programs that are categorized by the selected category and sub-category.

4. The method as set forth in claim 1, wherein the step of searching for programs comprises the steps of accessing program information regarding programs provided on channels in the broadcasting system during the predetermined timeframe, and comparing the program category of each program to the selected category.

5. The method as set forth in claim 1, wherein the step of generating an electronic program list further comprises the steps of:

if multiple broadcasts of the same program are scheduled during the predetermined timeframe, associating each start time of each of the broadcasts with a single occurrence of the program title, and eliminating multiple occurrences of the program title.

6. The method as set forth in claim 1, wherein the step of generating an electronic program list further comprising the step of sorting alphabetically the program titles such that the program titles are displayed alphabetically.

7. The method as set forth in claim 1, wherein the step of generating an electronic program list further comprises the steps of:

displaying a time bar along a horizontal axis identifying time increments in the predetermined timeframe;

displaying each program title on a row along a vertical axis; and said step of identifying each start time of the program comprises the step of displaying a start marker in the same row as the program title and in a column, identified by the time bar, corresponding to the start time of the program.

8. The method as set forth in claim 7, wherein the step of generating an electronic program list further comprises the steps of:

identifying each program that starts prior to the predetermined timeframe but is broadcasted during the predetermined timeframe; and displaying a broadcasting marker in the same row as the program title and in a column identified by the time bar to be the beginning of the timeframe.

9. The method as set forth in claim 1, further comprising the step of modifying the predetermined timeframe to specify an alternate timeframe, said system responding by updating the electronic program list to display each program of the selected category that occurs during the modified timeframe;

wherein the user can view program lists of selected categories of programs that occur during different timeframes.

10. The method as set forth in claim 1, wherein the program information extracted further comprises the channel on which each occurrence is broadcasted, a description of the program, and an end time of the program.

11. The method as set forth in claim 10, further comprising the steps of:

supplying a system pointer;

said user moving the pointer using a control device to an area in the electronic program guide associated with a start time of a program; and said system providing on the screen the description of the program, the start and end times and the channel on which the program is broadcasted at the identified start time.

12. The method as set forth in claim 11, wherein each program is further identified as by a sub-category, said system further providing on the screen the sub-category of the program.

13. The method as set forth in claim 1, wherein if an occurrence of a program is currently broadcasting, said method further comprises the steps of:

supplying a system pointer;

said user moving the system pointer using a control device to an area in the electronic program list associated with a broadcast marker adjacent to the program title of a currently broadcasting program; and said system tuning to a channel that the program is currently broadcasting on.

14. The method as set forth in claim 1, further comprising the steps of:

tuning to a first channel;

providing a broadcast of the first channel of a program on the screen;

superimposing the program list over the broadcast on the screen, such that only a portion of the video of the broadcast is covered by the electronic program guide;

wherein the user can view the electronic program guide while still receiving the audio and a portion of the video of the broadcast.

15. The method as set forth in claim 14, further comprising the steps of:

supplying a system pointer;

said user moving the system pointer using a control device to an area in the electronic program list associated with a broadcast marker adjacent to the program title of a currently broadcasting program; and said system tuning to a second channel that the program is currently broadcasting on, said electronic program guide remaining superimposed over the broadcast such that only a portion of the video of the broadcast is covered by the electronic program list.

16. The method as set forth in claim 1, further comprising the steps of:

supplying a system pointer;

said user moving the system pointer using a control device to an are in the electronic program list associated with the start time of an occurrence of a program;

if said program is a pay-per-view program, said system displaying a program purchase menu enabling the user to purchase the occurrence of the program to view.

17. A multiple channel broadcasting system comprising:

a screen for displaying video of broadcasts of programs;

an input device for inputting a selected category of programs;

a processor for processing program information, said processor identifying programs occurring during a predetermined timeframe which are categorized as the selected category and extracting program information comprising a title and start time of each identified program; and an on-screen electronic program list identifying programs of the selected category which are broadcasted during the predetermined timeframe comprising:

a list of the program titles of the programs categorized as the selected category; and adjacent to each program title, each start time of the program;

wherein a user can easily view by program category and start times such that multiple occurrences of the same program during the predetermined timeframe are viewable in one program list.

18. The system as set forth in claim 17, wherein the input device comprises a category menu comprising a list of categories displayed on the screen and a system pointer;

said system further comprising a control device operated by the user to move the pointer to point to areas associated with categories displayed in order to select categories.

19. The system as set forth in claim 18, wherein each program is further identified by a sub-category, said system further comprising a sub-category menu comprising a list of sub-catagories displayed on the screen, said user operating the control device to select sub-catagories, wherein the program list comprises programs that are categorized by the selected category and sub-category.

20. The system as set forth in claim 17, wherein the electronic program list further comprises a time bar displayed along a horizontal axis identifying time increments in the predetermined timeframe;

each program title being displayed on a row along a vertical axis; and each start time of the program identified by a start marker displayed in the same row as the program title and in a column, identified by the time bar, corresponding to the start time of the program.

21. The system as set forth in claim 20, wherein the electronic program list further comprises a broadcasting marker located in the same row as the program title and in a column, identified by the time bar to be the beginning of the timeframe for programs that start prior to the predetermined timeframe but are broadcasted during the predetermined timeframe.

22. The system as set forth in claim 17, wherein the program information extracted further comprises the channel on which each occurrence is broadcasted, a description of the program, and an end time of the program.

23. The system as set forth in claim 17, further comprising:

a receiver for receiving broadcasting data, said receiver comprising a tuner for tuning a selected channel;

at least one speaker for outputting audio of broadcasts of programs; and said on-screen electronic program list being superimposed over a portion of video of a broadcast on a channel tuned to by the tuner such that the audio is output through the speakers and only the portion of the video of the broadcast is covered by the electronic program list;

wherein the user can view the electronic program list while still receiving the audio and a portion of the video of the broadcast.

24. The system as set forth in claim 23, further comprising:

a system pointer which points to a location in the electronic program list; and a control device operated by the user to move the pointer to point to an area associated with a start time of a program;

said system providing on the screen the description of the program, the start and end times and the channel on which the program is broadcasted at the pointed to start time;

if the program is currently broadcasting, said tuner automatically tuning to the channel to provide a broadcast of the program.

25. The system as set forth in claim 24 wherein each program is further identified as by a sub-category, said system further providing on the screen the sub-category of the program.

26. The system as set forth in claim 24, further comprising:

a system pointer which points to a location in the electronic program list; and a control device operated by the user to move the pointer to point to an area associated with a start time of a program;

said system providing on the screen the description of the program, the start and end times and the channel on which the program is broadcasted at the pointed to start time; and if said program is a pay-per-view program, said system displaying a program purchase menu enabling the user to purchase the occurrence of the program to view.

* * * * *